United States Patent [19]

Schmidt

[11] Patent Number: 5,681,387
[45] Date of Patent: Oct. 28, 1997

[54] SEGMENTED SQUEEGEE BLADE

[75] Inventor: Ronald Paul Schmidt, St. Petersburg, Fla.

[73] Assignee: Jabil Circuit Company, St. Petersburg, Fla.

[21] Appl. No.: 400,623

[22] Filed: Mar. 6, 1995

Related U.S. Application Data

[63] Continuation of Ser. No. 56,710, Apr. 30, 1993, abandoned.
[51] Int. Cl.⁶ .................... B05C 1/02; B05D 5/12
[52] U.S. Cl. ................ 118/105; 118/100; 118/104; 118/126; 118/256; 427/96; 427/97
[58] Field of Search ............... 118/77, 126, 254, 118/256, 213, 413, 100, 104, 105, 109; 29/832, 840; 228/22, 23, 180.1; 361/760, 771; 15/121, 245, 236.01, 236.02, 236.06, 236.08; 427/96, 97

[56] References Cited

U.S. PATENT DOCUMENTS

| | | | |
|---|---|---|---|
| 2,842,789 | 7/1958 | Wells | 15/245 |
| 3,059,262 | 10/1962 | Marschner | 15/244.1 |
| 3,119,138 | 1/1964 | Davis | 15/245 |
| 3,204,278 | 9/1965 | Lambros | 15/244.1 |
| 3,464,351 | 9/1969 | De Hart et al. | 101/126 |
| 3,735,730 | 5/1973 | Mitter | 118/205 |
| 3,828,388 | 8/1974 | Fuhr | 15/236.02 X |
| 4,398,839 | 8/1983 | Kluck | 15/245 X |
| 4,515,304 | 5/1985 | Berger | 228/136 |
| 4,622,239 | 11/1986 | Schoenthaler et al. | 427/96 |
| 4,720,402 | 1/1988 | Wojcik | 427/282 |
| 4,761,881 | 8/1988 | Bora et al. | 29/840 |
| 4,872,261 | 10/1989 | Sanyal et al. | 29/840 |
| 4,893,556 | 1/1990 | Takakashi et al. | 101/123 |
| 4,919,970 | 4/1990 | Hoebener et al. | 427/96 |
| 4,998,342 | 3/1991 | Bonnell et al. | 29/840 |
| 4,998,500 | 3/1991 | Zimmer | 118/110 |
| 5,044,306 | 9/1991 | Erdmann | 118/120 |
| 5,047,262 | 9/1991 | de Vries et al. | 427/96 |
| 5,078,082 | 1/1992 | van Dyk Soerewyn | 118/213 |

FOREIGN PATENT DOCUMENTS

| | | |
|---|---|---|
| 1163045 | 9/1969 | United Kingdom . |
| 93/05887 | 4/1993 | WIPO . |

OTHER PUBLICATIONS

Fallon and Sanyal, "Double Sided, Surface Mounted PWB Quadruples Memory Size" Surface Mount Technology (SMT) (1984) The International Electronics Packaging Society, Inc.

Curtis Hart "Double Sided Attach Using Reflow Solder" Surface Mount Technology (SMT) vol. 3 part 2 (1986) The International Electronics Packaging Society, Inc.

Stephen Hinch "Handbook of Surface Mount Technology" (1988) Longman Scientific & Technical.

*Primary Examiner*—Long V. Le
*Attorney, Agent, or Firm*—Wilson Sonsini Goodrich & Rosati

[57] ABSTRACT

A segmented squeegee blade is provided for optimizing the flow of a depositable material such as viscous liquid or flowable medium such as solder paste, adhesive, or the like through a stepped stencil onto a substrate. The blade has a plurality of segments adapted for substantially independent deflection with respect to each other. The blade segments deflect and conform to a stepped surface or stencil to provide for more consistent deposition of flowable material. The squeegee blade also is adapted for use with stencils having more than two step levels. The segmented squeegee blade enables component density to be increased as compared to conventional methods.

21 Claims, 4 Drawing Sheets

SEGMENTED SQUEEGEE BLADE

This application is a continuation of application Ser. No. 08/056,710, filed Apr. 30, 1993, now abandoned.

BACKGROUND OF THE INVENTION

The field of this invention relates to a segmented squeegee blade apparatus and methods for using and making the segmented squeegee blade. More particularly, the field of the present invention relates to a segmented squeegee blade that substantially conforms to a stepped surface, that is, a surface having multiple levels or steps. This encompasses a large variety of uses including, but not limited to, scraping or spreading a coating material, such as paint, pasty media, gels, lubricants, adhesives or the like, along a stepped surface. It also encompasses, among other things, the deposition of a depositable material—such as viscous liquids like printing ink or lubricant, pasty or flowable media like solder paste, adhesives, or the like—through a stepped stencil onto a substrate. More particularly this aspect of the present invention relates to controllably depositing solder paste in a single step onto a printed circuit board.

Conventional techniques include a variety of methods for applying solder to printed circuitry substrates as well as various ways to control the amount of solder deposited at any given location on the substrate. Conventionally, solder paste is deposited through a stencil, that is, a metal mask or screen with apertures arranged in a pattern corresponding to the desired solder locations on the substrate. Normally, the thickness of solder deposited is controlled as a function of stencil thickness, where the thicker the stencil the more solder paste is deposited. The success of this method is limited by the design of conventional squeegee blades used to spread the solder paste and push it through the apertures.

U.S. Pat. No. 3,735,730 to Mitter discloses an apparatus for applying a flowable medium to a carrier. The apparatus is provided with a spreading element for applying the flowable medium evenly at all points and the pressure of which upon the exposed surface and the density of the applied flowable medium can be varied continuously during the operation of the apparatus.

When it is desired to mount both leaded through hole and surface mount components to a single printed circuit board, adjustments must be made in conventional techniques for applying solder. The amount of solder paste deposited at each component site is critical, and the amount required on through holes varies from that required at a surface mount land. The limits imposed by conventional squeegee blades when used with stencils of varying thickness has prompted a variety of more complex methods for differentiating between through holes and surface mount lands. One conventional method for attaching both pin in hole and surface mount components uses two solder applications. The solder paste is first applied to the surface mount sites by screen printing, then reflowed. This step is followed by a second step using wave soldering to apply solder to the pin in hole components.

Another method for attaching leaded through hole and surface mount components to a single printed circuit board is taught in U.S. Pat. No. 4,515,304 to Berger wherein the leaded through hole components are first placed on the printed circuit board. The lead ends are crimped to hold them in place while solder paste is applied, using individual applicator nozzles, to the lead ends and to solder pads for the surface mount components. Steps of inserting, crimping, turning the board and then applying solder are required. Then surface mount components may be placed on the second side of the printed circuit board and the whole reflow soldered.

The above methods are unduly complex and expensive since they require multiple steps for the application of solder. Other methods provide for single step solder application for both surface mount and leaded through hole components on the same side of a printed circuit board. U.S. Pat. No. 4,919,970 to Hoebener teaches a method for independent control of solder deposition amount into through holes and onto surface mount lands in one solder application step through a single stencil. Stencil thickness is the primary control for the amount of solder paste deposited for surface mount components, but through hole solder amounts are controlled as a function of the hardness of and application angle of the resilient squeegee used to push the solder paste through the stencil onto and into the through holes. This method requires determination and control of the hardness of the blade and the angle between the blade and stencil surface. The apparatus for this method requires a means for varying the angle of contact of the blade to the stencil. In addition, this method only distinguishes between surface mounts and through holes. To apply different amounts of solder to different components of the same type, such as surface mount lands, a conventional method is used—varying the thickness of the stencil.

The conventional method to control solder paste deposition uses a stepped, bi-level stencil where the thickness of the stencil varies between two different levels of steps to control the amount of solder deposited. Conventionally, a pliable material, such as urethane or the like, is used for the squeegee blade so that it will conform and deflect into the lower level of the stencil when downward pressure is applied. However, the pliable material also deflects downward into the component openings (apertures) on the upper level. The amount of deflection depends upon the pliability of the squeegee blade and upon the size and orientation of the component opening. This varying deflection into component openings on the upper level causes inconsistent amounts of solder paste to be deposited. The amount of inconsistency increases proportionally with the difference in the height of the two levels, increasing as the height difference increases. In addition, the pliable squeegee blade wears more quickly than the rigid, usually metal, squeegees used with single level stencils. In contrast to the pliable squeegee, the rigid squeegee provides very consistent solder deposition and simplified machine set up since factors such as downward pressure need not be controlled as precisely. However, conventional rigid stencils do not work well with stepped stencils since they do not deflect downward into a lower level as much as a pliable squeegee.

Some rigid metal squeegee blades have been developed that will deflect into a lower level with limited success. These squeegee blades flex enough to deflect partially into the relatively large stepped area, but are rigid enough not to deflect substantially into the relatively small component openings. These rigid squeegee blades will deflect downward into the middle of the lower level if the lower level is wide enough. However, these rigid squeegee blades will not deflect and conform to the lower level along the edges that form a boundary with the upper level. This necessitates that component openings on the lower level be placed in the middle of the step with substantial clearance between the lower level component openings and the upper level. This means that upper level components and lower level components may not be placed closely together. In addition, the overall density of components is limited, since component openings may not be placed on the lower level near the edge with the upper level.

It is apparent that what is needed is a squeegee blade that provides the advantages of rigid squeegee blades, yet will conform to the different steps or levels of a stepped or multi-level stencil. At the same time, the squeegee should be less expensive and complex to use than the method disclosed in U.S. Pat. No. 4,919,970 to Hoebener and should not require elaborate control of blade hardness and application angle.

SUMMARY OF THE INVENTION

In order to overcome the above-discussed disadvantages of known squeegee blades and solder deposition methods, one aspect of the present invention provides a segmented squeegee blade that will substantially conform to a stepped surface or stencil. The segmented squeegee blade forms at least one slit breaking the rigid blade into multiple adjacent squeegee segments each with their own blade edge.

The squeegee segments are sized so that some combination of adjacent squeegee segments aligns with each of the multiple steps of the surface or stencil, and may flex substantially independently of one another. This and other aspects of the invention have particular use for one step solder paste application through a stencil onto a printed circuit board having pads for surface mountable components and/or through holes for leaded components. Since the squeegee segments flex substantially independently, the amount of solder paste deposited is a function of the stencil thickness at a particular point and does not depend upon the pliability of the squeegee blade.

It is an advantage of these and other aspects of the present invention over conventional pliable squeegee blades that the segmented squeegee blade can be made out of a more durable rigid material such as steel or the like, and will not deflect as much into component openings. These and other aspects of the present invention provide the additional advantage over conventional pliable squeegee blades that simplified machine set up is allowed. For instance, such factors as downward pressure need not be controlled as precisely, since excess downward pressure does not cause the rigid squeegee blade segment to deflect into component openings to the same extent as pliable blades. It is an additional advantage of the foregoing and other aspects of the present invention over conventional pliable squeegee blades that the segmented squeegee blade provides for more consistent deposition of solder paste or other depositable material.

It is an advantage of the foregoing and other aspects of the present invention over conventional rigid squeegee blades that the segmented squeegee blade deflects and conforms more completely to the steps of the stepped surface or stencil. It is an additional advantage of these and other aspects of the present invention over conventional rigid squeegee blades that component density can be increased since a larger area of the steps is available for component openings.

It is an advantage of the foregoing and other aspects of the present invention over known squeegee blades that the segmented squeegee blade allows for a greater height variance between the highest and lowest stencil step. The variance is not limited by the pliability of the squeegee blade; the length of slits can be increased to allow deflection into lower steps. It is an additional advantage of the above and other aspects of the present invention over known squeegee blades that the present invention is easily adaptable for use with stencils having more than two step levels.

BRIEF DESCRIPTION OF THE DRAWINGS

These and other advantages of the present invention may be appreciated from studying the following detailed description of the presently preferred exemplary embodiment together with the drawings in which.

DETAILED DESCRIPTION

Figure 1:
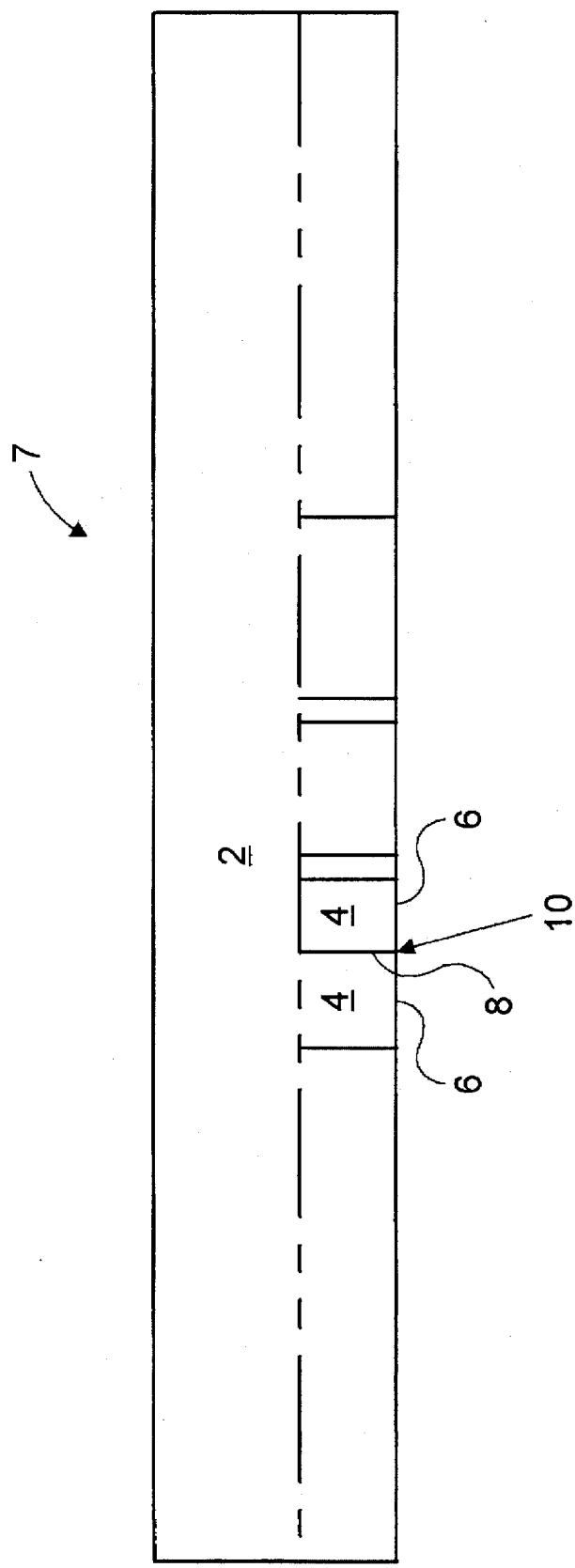
FIG. 1 is a side view of a first embodiment according to the present invention.

Referring to FIG. 1, the apparatus according to the present invention provides a base 2, and at least two adjacent squeegee segments 4, each squeegee segment being attached to the base and having a blade edge 6. In the presently preferred exemplary first embodiment, each blade edge 6 is substantially straight to conform to a surface or stencil having substantially flat step areas. The segmented squeegee blade 7 forming at least one slit 8 between the adjacent squeegee segments 4, each slit 8 having an open end 10 separating the blade edges 6 of the adjacent squeegee segments 4. Those having ordinary skill in this field will understand that squeegee blades may come in a wide variety of shapes and sizes and may be shaped so as to be received by a holding device or to conform with different surfaces, such as a slanted surface or stencil. It is to be understood that this invention is directed at a segmented squeegee blade, of any shape or size, having at least two squeegee segments, each of which flexes substantially independently of other squeegee segments.

Figure 3:
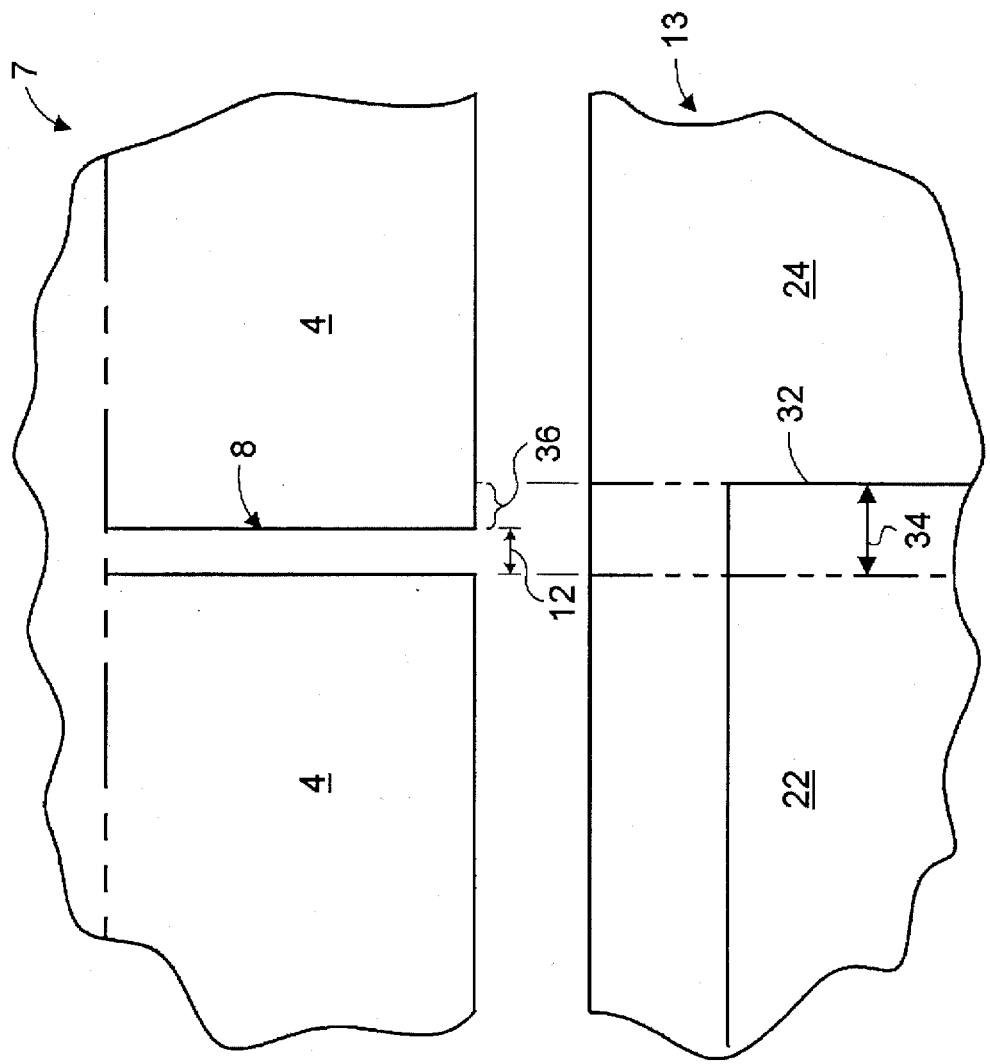
FIG. 3 both an enlarged side view of a portion of the first embodiment according to the present invention and an enlarged top view of a corresponding portion of the first stencil with which the first embodiment may be used.

FIG. 3 includes an enlarged side view of the slit 8 and adjacent squeegee segments 4 of FIG. 1. Referring to FIG. 3, the at least one slit 8 has a width 12 of about three thousandths of an inch. The slit should be as narrow as possible while still allowing substantially independent flexing of adjacent squeegee segments to prevent the coating material or depositable material used with the blade from seeping through the slit and forming a trail along the stepped surface to which the segmented squeegee blade is applied. Those having ordinary skill in this field will understand that desirable slit widths will vary with the nature of the coating material or depositable material being used. Wider slits may be used with more tacky or viscous materials. For example, a slit with a width less than about five thousandths of an inch is desirable for conventional solder paste which is about 90% metal by weight, the metal being about 63% tin and 37% lead. The width of the slit may vary along the length of the slit and still prevent seepage; it is the width of the slit between the blade edges of the adjacent squeegee segments that is most important, since this is the part of the blade making the most contact with the coating material or depositable material. In the first embodiment, the at least one slit 8 is substantially straight, and the at least one slit 8 is substantially orthogonal to the blade edges 6 of the adjacent squeegee segments 4. Those having ordinary skill in this field will understand that the shape of the slit and the angle between the slit and the blade edges of the adjacent squeegee segments may vary while still allowing the squeegee segments to flex substantially independently. For instance, a T-shaped slit can be used to increase flexibility of the squeegee segments which will have less area of attachment with the base as a result.

The apparatus according to the first embodiment of the present invention is comprised of a material characterized by being both rigid and resilient, such as steel, certain hardened plastics, composites or the like. The adjacent squeegee segments 4 should be able to flex substantially resiliently while the blade edges 6 are substantially rigid. The presently preferred exemplary first embodiment is comprised of blued spring steel and is plated with teflon infused nickel to increase durability and reduce slit width 12.

The first embodiment depicted in FIG 1 is substantially planar, providing a fairly uniform resiliency and allowing it to easily be mounted to a holding means, although a variety of other shapes, such as wedge shapes, can be used.

Figure 2:
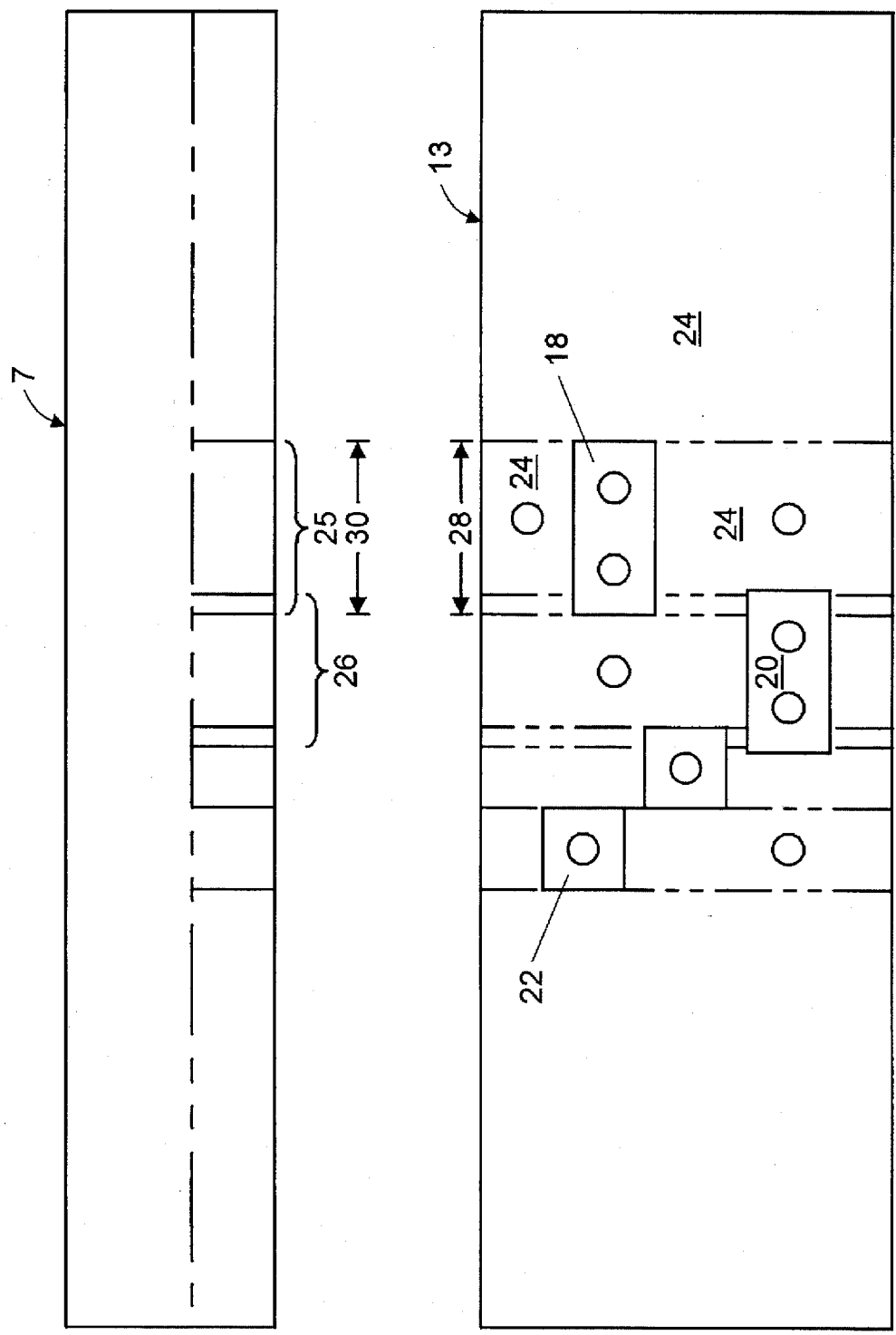
FIG. 2 is both a side view of a first embodiment according to the present invention and a top view of a corresponding first stencil with which the first embodiment may be used.

FIG. 2 includes a side view of a segmented squeegee blade 7 according to the present invention and a top view of a corresponding stencil 13. Referring to FIG. 2, the stencil comprises a plurality of step areas 18, 20, 22 and 24 (delimited in FIG. 2 by both solid and dashed lines). Step areas 24 being at a top level of the stencil; step areas 18, 20, and 22 being at a recessed lower level of the stencil. The segmented squeegee blade 7 substantially conforms to a surface, in this case stencil 13, the surface having a plurality of step areas. The segmented squeegee blade 7 has a combination of adjacent squeegee segments corresponding to each step area of the surface, stencil 13. For example, the combination of adjacent squeegee segments 25 corresponds to the step area 18, and the combination of adjacent squeegee segments 26 corresponds to the step area 20.

Each step area, has a step width; for instance step area 18 has a respective step width 28. Each combination of adjacent squeegee segments has a combination width, being about equal to the step width of the corresponding step area. For instance combination 25 has a combination width 30, being about equal to step width 28. While each step width is about equal to the step width of the corresponding step area, the first embodiment provides for a clearance distance so that squeegee segments deflecting into a step area will not scrape against the walls of the step area. If the squeegee segment deflects into a step area with two walls, it will have a clearance distance on both edges of the squeegee segment. Since slits in the first embodiment are placed so squeegee segments that deflect into a recessed step area are narrower than the step width, squeegee segments on a top level step area may be wider than the top step area and slightly overhang the adjacent lower step area. Thus, each respective combination of adjacent squeegee segments has a respective combination width being no greater than twice a clearance distance greater than, and no less than twice the clearance distance less than, the step width of the corresponding step area.

Figure 4:
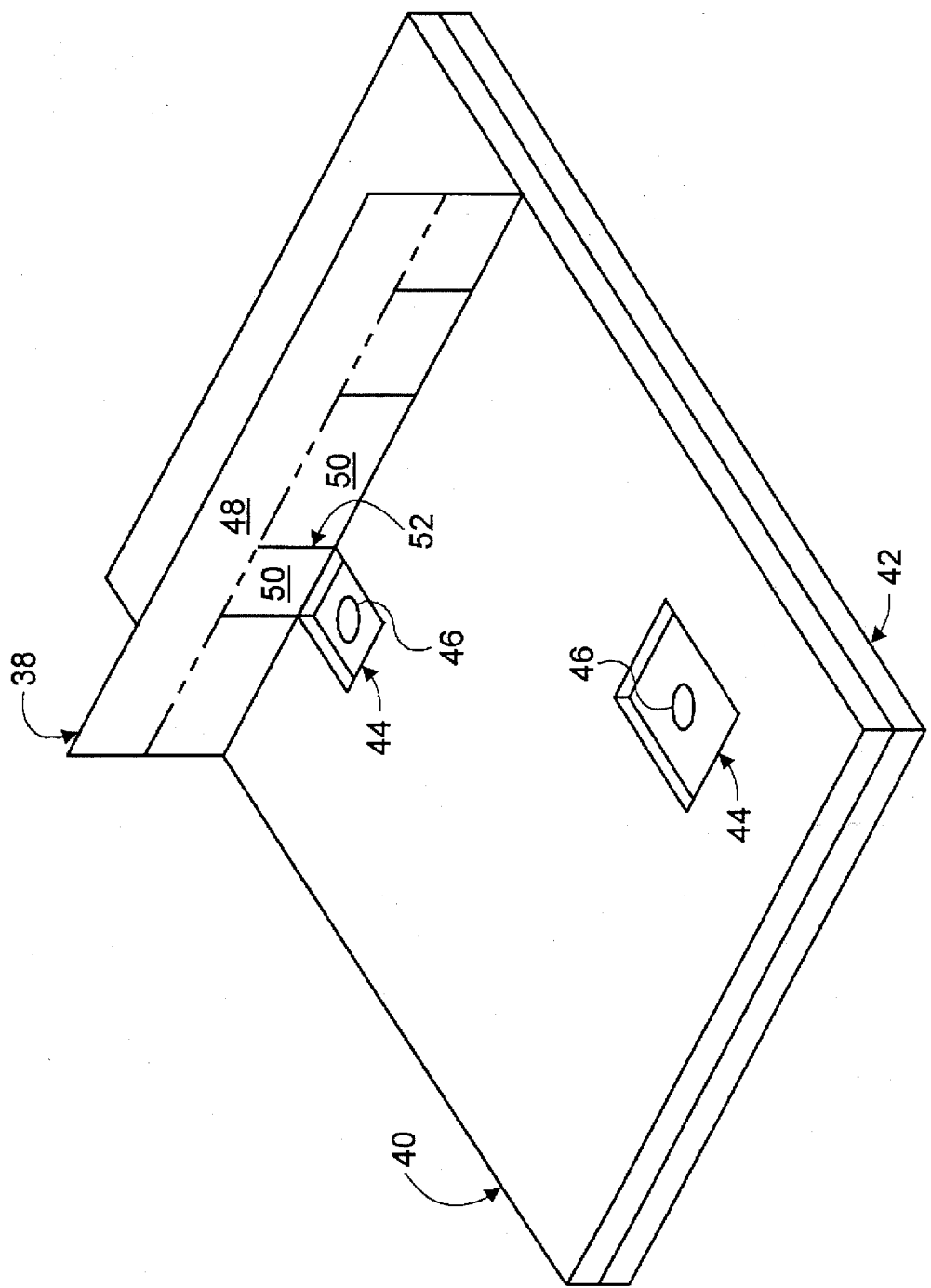
FIG. 4 is an orthographic view of a second embodiment being applied to a second stencil according to the present invention.

FIG. 3 is an enlarged view of a portion of FIG. 2 including part of a step area 22, having a step wall 32. A clearance distance is shown at 34. No squeegee segment deflecting into recessed step area 22 should come substantially closer to step wall 32 than the clearance distance 34. The squeegee segment corresponding to the upper step area 24, however, may overhang the clearance distance 34 of step 22. The slit 8 is placed to provide for clearance distance 34. The portion of the segmented squeegee blade 7 in FIG. 3 aligns with the portion of the stencil 13 such that blade edge portion 36 overhangs part of step area 22 by less than clearance distance 34. The clearance distance is the sum of slit width 12 and the width of blade edge portion 36. The first embodiment has a clearance distance 34 about equal to ten thousandths of an inch. With reference to FIG. 4, the clearance distance is predicated on the apertures 46 in the step areas 44. A squeegee segment 50 that moves over a component in a step area 44 is designed to overlap the component to allow for blade adjustment.

Those having ordinary skill in this field will understand that the placement and size of slits and sizing of squeegee segments may vary widely since they derive from the geometry of the surface with which the segmented squeegee blade will be used. It is to be understood that this invention is directed at all such segmented squeegee blades.

FIG. 4 is an orthographic view of a second embodiment of a segmented squeegee blade 38 being applied to a surface, in this case stencil 40. FIG. 4 illustrates a method for depositing a depositable material, such as viscous liquids, pasty media, flowable media or the like, onto a substrate 42, comprising the steps of:

providing a stencil 40 having a top surface with a plurality of step areas 44, the stencil forming at least one aperture or opening 46;

providing a segmented squeegee blade 38 having a base 48, and at least two adjacent squeegee segments 50, each squeegee segment being attached to the base and having a blade edge, the segmented squeegee blade forming at least one slit 52 between the adjacent squeegee segments 50, each slit 52 having an open end separating the blade edges of the adjacent squeegee segments, there being a combination of adjacent squeegee segments corresponding to each step area of the surface;

placing the stencil 40 over the substrate 42;

applying the depositable material to the top surface of the stencil 40;

placing the segmented squeegee blade 38 against the stencil 40 such that each blade edge makes contact with the stencil, and such that each combination of adjacent squeegee segments substantially aligns with the corresponding step area 44 of the stencil;

moving the segmented squeegee blade 38 along the top surface of the stencil 40 such that each combination of adjacent squeegee segments substantially conforms to, and pushes the depositable material along, the corresponding step area 44 of the stencil, and such that the squeegee blade 38 pushes the depositable material onto the substrate 42 through the at least one opening 46 in the stencil 40.

The depositable material may comprise, but is not limited to, solder paste and the substrate may comprise, but is not limited to, a printed circuit board.

One aspect of this invention also relates to a method for making a segmented squeegee blade for a depositable material, such as viscous liquids, pasty media, flowable media or the like, onto a substrate through a stencil, the stencil having a plurality of step areas, each step area having a step width, comprising the steps of:

measuring the step width of each step area;

providing a piece of resilient material having a blade edge, such as a planar piece of blued spring steel. In the first embodiment the blade edge is substantially straight.

measuring a plurality of desired adjacent squeegee segments along the blade edge, there being a combination of desired adjacent squeegee segments corresponding to each step area of the stencil, each combination of desired adjacent squeegee segments having a combination width being no greater than twice a clearance distance greater than, and no less than twice the clearance distance less than, the step width of the corresponding step area.

cutting transversely through the blade edge into the resilient material between desired adjacent squeegee segments, to form at least one substantially straight slit separating the desired adjacent squeegee segments into actual adjacent squeegee segments so that each actual squeegee segment flexes substantially independently of the adjacent actual squeegee segments.

The slit may be cut with electronic discharge machining (EDM). The length of the slit in the first embodiment is about 400 thousandths of an inch, but can be varied to allow different step levels and different amounts of flexibility and resiliency of squeegee segments.

The at least one slit may be narrowed and the durability of the squeegee blade increased by then plating the segmented squeegee blade with a plating material. The currently preferred plating material is nickel infused teflon, but various other plating materials or coatings may be used. The amount the slit width is decreased and the effect on durability will, of course, depend upon the actual material used.

The foregoing description is offered primarily for purposes of illustration. One modification is that suitable materials other than blued spring steel and nickel infused teflon may be used. Additionally, the actual geometry of the segmented squeegee blade will vary depending upon the virtually unlimited possible shapes of surfaces and stencils with which the segmented squeegee blade used and for which the segmented squeegee blade may be designed.

For example, one aspect of the invention contemplates that the slits need not necessarily be straight, but rather may be disposed at any convenient angle so as to effectively minimize the width of the slits. Accordingly, a slit could be cut at a 45° angle with respect to the blade edge. And, adjacent blades would overlap slightly. It will be appreciated that cutting the slit at an angle has the advantage of reducing the width of slit such that the slit width could be optimized for a particular solder composition.

While the invention has been described in connection with what is presenting to be considered to be the most practical and preferred embodiments, it is to be understood that the invention is not limited to the disclosed embodiments but, on the contrary is intended to cover various modifications and equivalents arrangements included within the spirit and scope of the appended claims. For example, a plurality of discrete blades could be held by a holder. That is, each blade segment could constitute a separate entity wherein a plurality of blade segments are held by a holder. The blades do not necessary have to be integral with a single base.

While a variety of embodiments have been disclosed, it will be readily apparent to those skilled in the art that numerous other modifications and variations not mentioned above can still be made without departing from the spirit and scope of the invention claimed below.

What is claimed is:

1. A squeegee blade for applying a medium to a stencil having a surface elevation and having step areas, including a first step area and a second step area each having an elevation that differs from the surface elevation of the stencil, said squeegee blade comprising:

a base;

a first squeegee segment and a second squeegee segment extending from the base, the first squeegee segment and the second squeegee segment each having at least two ends, a first end being coupled to the base and a second end forming a blade edge for applying the medium;

the first squeegee segment and the second squeegee segment forming a combined blade edge having a size sufficient to substantially span the first step area;

the blade edge of the second squeegee segment having a size sufficient to substantially span the second step area and having a position such that the second squeegee segment deflect onto the second step area;

wherein the squeegee blade is of such size that when the squeegee blade is swept across the stencil, the combined blade edge applies the medium to the first step area, and the blade edge of the second squeegee segment applies the medium to the second step area.

2. A squeegee blade according to claim 1, wherein the second squeegee segment deflects substantially independently of the first squeegee segment while applying the medium to the second step area.

3. A squeegee blade according to claim 1, wherein the squeegee blade comprises a material characterized by both rigidity and resiliency.

4. A squeegee blade according to claim 1, wherein the first step area has a width, the second step area has a width, the combined blade edge has a width, and the blade edge of the second squeegee segment has a width; and wherein the width of the combined blade edge is substantially equal to the width of the first step area, and the width of the blade edge of the second squeegee segment is substantially equal to the width of the second step area.

5. A squeegee blade for applying a medium to a stencil having step areas, including a first step area, a second step area, and a third step area, wherein the second step area has a different elevation than the first step area and the third step area, said squeegee blade comprising:

a base;

a plurality of squeegee segments extending from the base, each of the squeegee segments having at least two ends, a first end being coupled to the base and a second end forming a blade edge for applying the medium;

the plurality of squeegee segments forming at least three different groups of adjacent squeegee segments, a first group, a second group and a third group, the first group containing at least a first squeegee segment and forming a first group blade edge of a size sufficient to substantially span the first step area;

the second group containing at least a second squeegee segment and forming a second group blade edge of a size sufficient to substantially span the second step area;

the third group containing at least the first squeegee segment and the second squeegee segment and forming a third group blade edge of a size sufficient to substantially span the third step area; wherein the squeegee blade is of sufficient size that when the squeegee blade is swept across the stencil, the first group of adjacent squeegee segments applies the medium to the first step area, the second group of adjacent squeegee segments applies the medium to the second step area, and the third group of adjacent squeegee segments applies the medium to the third step area.

6. A squeegee blade according to claim 5, wherein said first group contains at least one additional squeegee segment that is not a member of said third group.

7. A squeegee blade according to claim 5, wherein said second group contains at least one additional squeegee segment that is not a member of said third group.

8. A squeegee blade according to claim 5, wherein the first step area and the second step area are positioned to intersect to form a wall, the second step area is recessed relative to the first step area, and the second step area has a width; and wherein the size of the second group blade edge is such that a distance is formed between the second group blade edge and the wall when the second group blade edge applies the medium to the second step area, said distance providing a clearance between the second group blade edge and the wall that is substantially less than the width of the second step area.

9. The squeegee blade according to claim 8, wherein the distance that is formed between the second group blade edge and the wall when the second group blade edge applies the medium to the second step area is no greater than about 20 thousandths of an inch.

10. The squeegee blade according to claim 5, wherein the first group blade edge and the second group blade edge each have a width, and the width of the first group blade edge is substantially different than the width of the second group blade edge, whereby the medium may be applied to step areas of differing width.

11. The squeegee blade according to claim 5, wherein the number of squeegee segments in any given group is no greater than the number of step areas on the surface.

12. The squeegee blade according to claim 5, wherein the second step area is recessed relative to the first step area, and wherein the second group blade edge is sized such that it may deflect into the second step area.

13. The squeegee blade according to claim 5, wherein the first step area and the third step area each have an elevation, and the elevation of the first step area is substantially the same as the elevation of the third step area.

14. A squeegee blade for depositing a medium into components holes formed in a stepped stencil surface, the stepped stencil surface having step areas, including a first step area, a second step area, and a third step area, wherein the second step area has a different elevation than the first step area and the third step area, and wherein each of said first, second, and third step areas contain at least one component hole for receiving the medium, said squeegee blade comprising:

a base;

a first squeegee segment and a second squeegee segment extending from the base, the first squeegee segment and the second squeegee segment each having at least two ends, a first end being coupled to the base and a second end forming a blade edge for depositing the medium;

the blade edge of the first squeegee segment being wider than the component hole in the first step area, the blade edge of the second squeegee segment being wider than the component hole in the second step area, and the blade edges of the first squeegee segment and the second squeegee segment forming a combined squeegee segment having a combined blade edge that is wider than the component hole in the third step area;

the first squeegee segment and the second squeegee segment having positions such that: the first squeegee segment may deflect onto the first step area and bridge the component hole in the first step area, the second squeegee segment may deflect onto the second step area and bridge the component hole in the second step area, and the combined squeegee segment may deflect onto the third step area and bridge the component hole in the third step area;

wherein the squeegee blade is of such size that when the squeegee blade is swept across the stencil, the first squeegee segment deposits the medium into the component hole in the first step area, the second squeegee segment deposits the medium into the component hole in the second step area, and the combined squeegee segment deposits the medium into the component hole in the third step area.

15. A squeegee blade according to claim 14, wherein the second step area has at least one additional component hole, and the blade edge of the second squeegee segment is wide enough to bridge all of the component holes in the second step area.

16. A squeegee blade according to claim 14, wherein the third step area has at least one additional component hole, and the combined blade edge is wide enough to bridge all of the component holes in the third step area.

17. A squeegee blade according to claim 15, wherein the third step area has at least one additional component hole, and the combined blade edge is wide enough to bridge all of the component holes in the third step area.

18. A squeegee blade according to claim 14, wherein the first squeegee segment is sized to substantially span the first step area, the second squeegee segment is sized to substantially span the second step area, and the combined squeegee segment is sized to substantially span the third step area.

19. The squeegee blade according to claim 14, wherein the second step area is recessed relative to the first step area, and wherein the second squeegee segment is sized such that it may deflect into the second step area.

20. The squeegee blade according to claim 19, wherein the first step area is adjacent to the second step area, and the blade edge of the first squeegee segment is substantially rigid such that it will bridge the component hole in the first step area without substantially deforming when sufficient downward force is applied to said squeegee blade to cause the blade edge of the second squeegee segment to deflect onto the second step area.

21. The squeegee blade according to claim 14, wherein the squeegee blade comprises metal.

\* \* \* \* \*